(12) United States Patent
Hoentschel et al.

(10) Patent No.: US 9,029,214 B2
(45) Date of Patent: May 12, 2015

(54) INTEGRATED CIRCUITS AND METHODS FOR FABRICATING INTEGRATED CIRCUITS WITH IMPROVED SILICIDE CONTACTS

(71) Applicant: GLOBALFOUNDRIES, Inc., Grand Cayman (KY)

(72) Inventors: Jan Hoentschel, Dresden (DE); Stefan Flachowsky, Dresden (DE); Nicolas Sassiat, Dresden (DE); Ran Yan, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/740,974

(22) Filed: Jan. 14, 2013

(65) Prior Publication Data
US 2014/0197498 A1    Jul. 17, 2014

(51) Int. Cl.
*H01L 21/8238* (2006.01)
*H01L 29/66* (2006.01)
*H01L 29/78* (2006.01)

(52) U.S. Cl.
CPC .............. *H01L 29/665* (2013.01); *H01L 29/78* (2013.01)

(58) Field of Classification Search
USPC .................. 257/E21.626, E21.64; 438/230
See application file for complete search history.

(56) References Cited

U.S. PATENT DOCUMENTS

2007/0122955 A1*   5/2007   Luo et al. ...................... 438/197
2008/0237726 A1*  10/2008   Dyer ............................ 257/369

* cited by examiner

*Primary Examiner* — Amar Movva
(74) *Attorney, Agent, or Firm* — Ingrassia Fisher & Lorenz, P.C.

(57) ABSTRACT

Integrated circuits and methods for fabricating integrated circuits are provided herein. In an embodiment, a method for fabricating an integrated circuit includes forming over a semiconductor substrate a gate structure. The method further includes depositing a non-conformal spacer material around the gate structure. A protection mask is formed over the non-conformal spacer material. The method etches the non-conformal spacer material and protection mask to form a salicidation spacer. Further, a self-aligned silicide contact is formed adjacent the salicidation spacer.

19 Claims, 3 Drawing Sheets

INTEGRATED CIRCUITS AND METHODS FOR FABRICATING INTEGRATED CIRCUITS WITH IMPROVED SILICIDE CONTACTS

TECHNICAL FIELD

The technical field generally relates to integrated circuits and methods for fabricating integrated circuits, and more particularly relates to integrated circuits and methods for fabricating integrated circuits with improved silicide contacts.

BACKGROUND

Continued scaling in semiconductor technology increases marginalities, variabilities, and challenges in manufacturing. Further, continued scaling in poly pitches between devices results in a shrinking space where several implant processes, stress memorization techniques, silicidation, dual stress liner formation and strained contact formation must occur.

Modern integrated circuits use several poly pitches depending on their device gate lengths. To ensure proper device targeting, conformal spacer materials must be deposited. However, the use of conformal spacers results in certain drawbacks, including performance degradation and increased effort in manufacturing. Further, multiple spacer formations for a device results in less space for implantation, silicidation, and contact formation as the poly pitch decreases. Typically, after spacer formation a protection layer is formed to protect the P poly and diffusion resistors from silicide formation. With the reduced available space, formation of the protection layer is difficult and often results in unwanted residuals that prevent appropriate silicide formation and cause yield fallout.

Accordingly, it is desirable to provide integrated circuits and methods for fabricating integrated circuits with improved silicide contacts. Also, it is desirable to provide integrated circuits and methods for fabricating integrated circuits with non-conformal silicidation spacers. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for fabricating integrated circuits are provided herein. In one exemplary embodiment, a method for fabricating an integrated circuit includes forming over a semiconductor substrate a gate structure. The method further includes depositing a non-conformal spacer material around the gate structure. A protection mask is formed over the non-conformal spacer material. The method etches the non-conformal spacer material and protection mask to form a salicidation spacer. Further, a self-aligned silicide contact is formed adjacent the salicidation spacer.

In another embodiment, a method for fabricating an integrated circuit is provided. The method for fabricating an integrated circuit includes forming a gate structure over a semiconductor substrate and forming a conformal spacer around the gate structure. The method also includes performing an ion implantation into the semiconductor substrate using the conformal spacer as a mask. In the method, the conformal spacer is removed and a non-conformal spacer material is deposited around the gate structure. The non-conformal spacer material is etched to form a salicidation spacer. The method forms a self-aligned silicide contact adjacent the salicidation spacer.

In another embodiment, an integrated circuit is provided. The integrated circuit includes a gate structure formed on a semiconductor substrate. The gate structure includes a high-k dielectric layer, a metal electrode formed over the high-k dielectric layer, a gate cap formed over the metal electrode, and an electrode adjacent spacer formed around the gate cap and metal electrode. The integrated circuit also includes a salicidation spacer formed around the gate structure. Further, the integrated circuit includes a source/drain extension region formed in the semiconductor substrate and aligned with the electrode adjacent spacer, a self-aligned silicide contact formed in the semiconductor substrate adjacent the salicidation spacer, and a deep source/drain region formed in the semiconductor substrate in non-alignment with the silicidation spacer.

BRIEF DESCRIPTION OF THE DRAWINGS

Embodiments of integrated circuits and methods for fabricating integrated circuits with improved silicide contacts will hereinafter be described in conjunction with the following drawing figures, wherein like numerals denote like elements, and wherein.

DETAILED DESCRIPTION

The following detailed description is merely exemplary in nature and is not intended to limit integrated circuits or the methods for fabricating integrated circuits as claimed herein. Furthermore, there is no intention to be bound by any expressed or implied theory presented in the preceding technical field, background or brief summary, or in the following detailed description.

In accordance with the various embodiments herein, integrated circuits and methods for fabricating integrated circuits with improved silicide contacts are provided. Performance issued faced by conventional processes for forming silicide contacts in integrated circuits having variable, single or dual pitch, and reduced pitches may be avoided. Specifically, it is contemplated herein that in certain embodiments the conformal deep source/drain implant spacer may be removed after implant formation and replaced with a non-conformal salicidation spacer. Further, a resist mask may be integrated with the non-conformal salicidation spacer for efficient processing.

FIGS. 1-5 illustrate steps in accordance with various embodiments of methods for fabricating integrated circuits. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Figure 1:
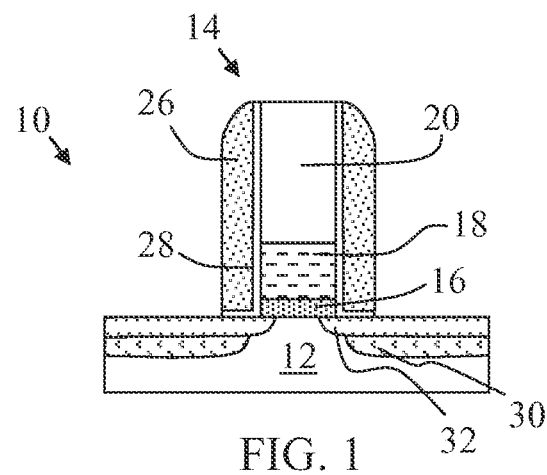
FIGS. 1-5 illustrate, in cross section, a portion of an integrated circuit and method steps for fabricating an integrated circuit in accordance with various embodiments herein.

In FIG. 1, in an exemplary embodiment, the method for fabricating an integrated circuit 10 begins by providing a semiconductor substrate 12. A gate structure 14 is formed over the semiconductor substrate 12. The exemplary gate structure 14 is a high-k metal gate formed according to a conventional gate first process. As shown, the gate structure 14 includes a high-k dielectric layer 16 that is formed on the semiconductor substrate 12. An exemplary high-k dielectric layer 16 is nitrided hafnium silicate (HfSiON). Further, the gate structure 14 includes a metal gate electrode material 18 which lies over the high-k dielectric layer 16. As shown, the gate structure 14 also includes a gate cap 20 that covers the metal gate electrode material 18. An exemplary gate cap 20 is formed from polysilicon. The gate structure 14 is considered to further include an electrode adjacent spacer 26 and a liner 28. An exemplary liner 28 is silicon nitride which is conformally deposited, such as by atomic layer deposition (ALD). An exemplary spacer 26 is silicon oxide.

With the gate structure 14 formed as illustrated in FIG. 1, through typical lithographic processing, source/drain regions may be formed in the semiconductor substrate 12. Specifically, halo regions 30 may be formed in the semiconductor substrate 12 by performing an ion implantation using the spacer 26 as a mask. Further, shallow extension regions 32 also may be formed in the semiconductor substrate 12 by performing an ion implantation using the spacer 26 as a mask. Thereafter, an anneal is performed to activate the implanted dopants.

Figure 2:
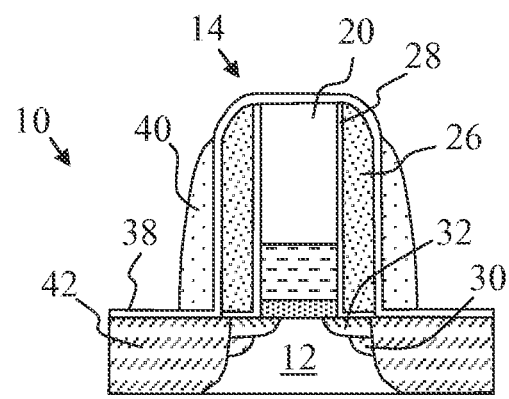

After the implantation/anneal processes are complete, a process for forming deep source/drain regions is performed. Specifically, as shown in FIG. 2, a liner 38 is deposited over the gate structure 14 and semiconductor substrate 12. An exemplary liner 38 is silicon oxide. Then, a spacer material is conformally deposited over the liner 38 and is etched to form the spacer 40. An exemplary spacer material is silicon nitride which may be conformally deposited by ALD or plasma-enhanced atomic layer deposition (PEALD). After formation of the spacer 40, another ion implantation and anneal process is performed. An ion implantation process uses the spacer 40 as a mask to form deep source/drain regions 42.

Figure 3:
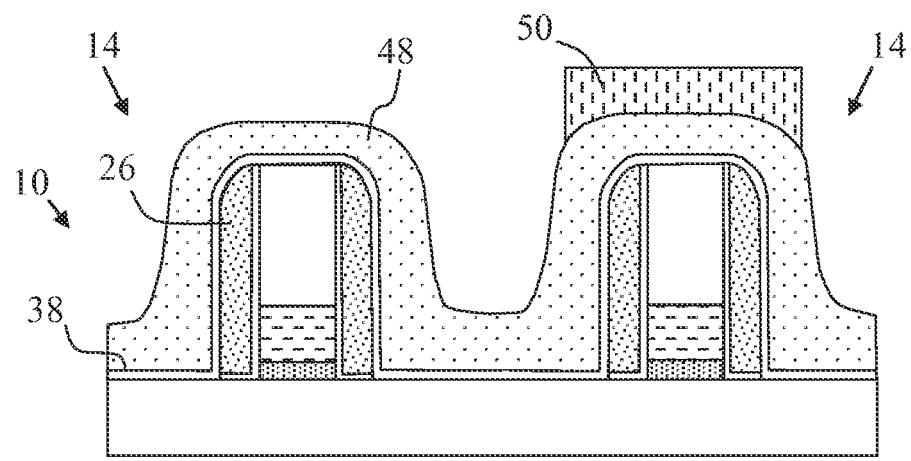
Figure 4:
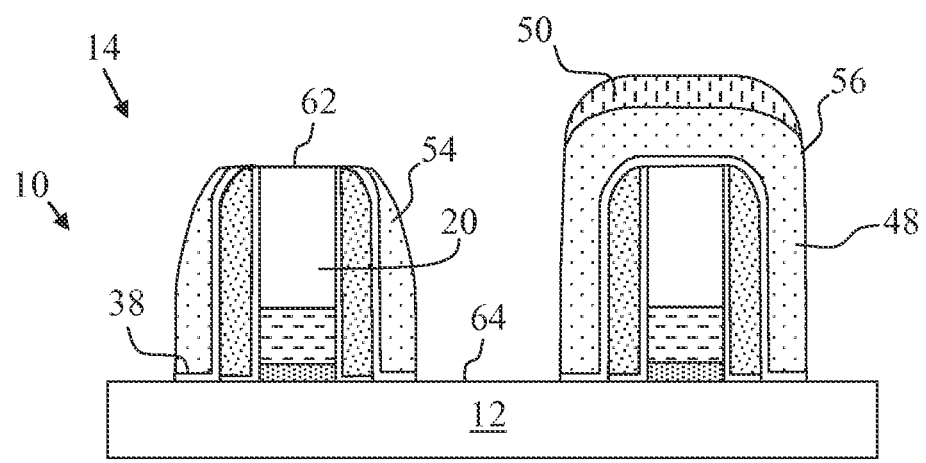

After formation of the deep source/drain regions 42, the spacer 40 is removed, as shown in FIG. 3. (FIG. 3 illustrates two gate structures 14 to discuss distinct processing for separate gate structures). In an exemplary process, the spacer 40 is removed by hot phosphoric acid or by a dry etch selective to remove the spacer 40, e.g., silicon nitride (SiN). In either case, vulnerable components of the gate structure 14 are well encapsulated by the silicon oxide liner 38 and spacer 26. After the spacer 40 is removed, a spacer material 48 is non-conformally deposited over the liner 38. In an exemplary embodiment, silicon nitride (SiN) is non-conformally deposited by plasma-enhanced chemical vapor deposition (PECVD). A protection mask 50 is then deposited over selected gate structures 14 where electrical contacts are not desired. For example, certain gate structures 14 will form resistors, such as P+ poly resistors and N− diffusion resistors, on which contacts are not desired. An exemplary protection mask 50 is a spin coating that is spun onto the integrated circuit 10 and selectively removed to cover the spacer material 48 over selected gate structures 14 before being developed.

It is noted that in conventional processing, formation of the protection mask over the conformal spacer leads to the formation of bottlenecks with underlying pockets. Residual resist accumulates in the pockets and is not developed. The undeveloped residual resist greatly reduces manufacturing yield. In the current process, the usable space between gate structures is increased by the removal of the conformal spacer. As a result, no bottlenecks and pockets are formed and the formation of undeveloped residual resist is inhibited.

After forming the protection mask 50, an etch process is performed to expose surfaces 62 and 64 where contacts are desired. As shown, the etch process removes portions of spacer material 48 to form spacers 54 around gate structures 14 where contacts are desired and to form spacers 56 including spacer material 48 and protection mask 50 around gate structures 14 where contacts are not desired. The etch process may remove portions of the protection mask 50 as desired. As shown, the etch removes the liner 38 from the surface 62 of the gate cap 20 and from portions of the surface 64 of the semiconductor substrate 12.

Figure 5:
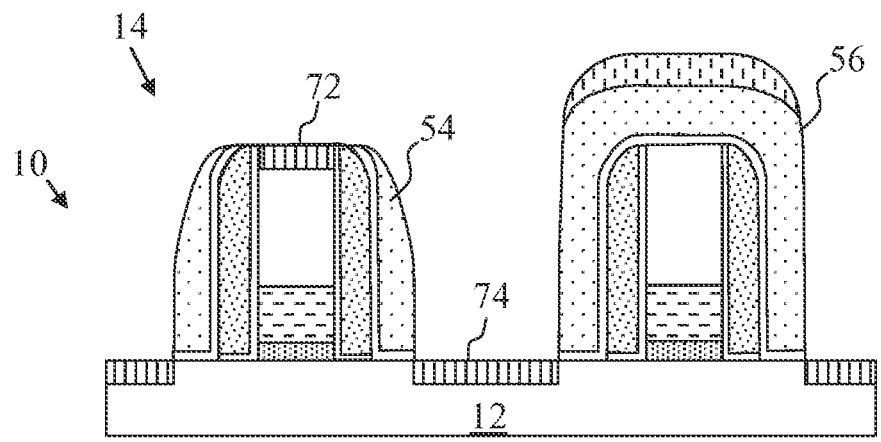

In FIG. 5, a metal has been deposited over the integrated circuit 10 and reacted to form silicide contacts 72 on selected gates 14 and silicide contacts 74 to selected source/drain regions in the semiconductor substrate 12. The unreacted metal is then removed. As shown, the spacers 54 and 56 do not react with the metal. As a result, the spacers 54 and 56 provide for self-aligned silicide (salicide) contacts 72 and 74. In an exemplary embodiment, the silicide contacts are nickel silicide (NiSi), cobalt silicide (CoSi), or nickel platinum silicide (NiPtSi).

The resulting integrated circuit includes a gate structure formed on a semiconductor substrate and including a high-k dielectric layer, a metal electrode formed over the high-k dielectric layer, a gate cap formed over the metal electrode, and an electrode adjacent spacer formed around the gate cap and metal electrode; a salicidation spacer formed around the gate structure; a source/drain extension region formed in the semiconductor substrate and aligned with the electrode adjacent spacer; a self-aligned silicide contact formed in the semiconductor substrate adjacent the salicidation spacer; and a deep source/drain region formed in the semiconductor substrate in non-alignment with the silicidation spacer. Specifically, the deep source/drain regions are formed with the removed spacer 40 and are not aligned with the regions formed in alignment with the electrode adjacent spacer or with the silicide contacts.

As a result of the process described above, sufficient space between gate structures is provided for the formation of silicide contacts by removing conformal implantation spacers and replacing them with non-conformal salicidation spacers. At very tight pitches, non-conformal layers form overhangs which create voids that cannot be etched. As a result, resist residuals will occur due to non-exposure during photoresist developing. Further, the final spacer width will be different for small and wide pitch devices and a different device behavior at the same device length may occur. Through the use of dedicated non-conformal silicidation spacers, the distance between silicide contacts and gate channels can be adjusted individually to the selected gate channel and source/drain region. Also, the process avoids the creation of undeveloped resist residual during formation of the protection mask. As a result of the processes described above, the integrated circuits and methods for fabricating integrated circuits provide lower serial resistance in PMOS devices, lower contact resistance, increased yield, and increased performance—particularly for PFETs located far from silicide contacts. For example, with more space, sufficient silicidation can occur and the resistance between the contact and source/drain will be lower, improving device performance. For high-k metal gate first processes, the process provides for sufficient encapsulation of the gate structures to enable a high yield manufacturing process. Further, the fabrication methods described herein are easily incorporated into existing fabrication processes.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit comprising:
   forming a gate structure overlying a semiconductor substrate;
   forming a conformal spacer around the gate structure;
   performing an ion implantation into the semiconductor substrate using the conformal spacer as a mask;
   removing the conformal spacer;
   after removing the conformal spacer, depositing a non-conformal spacer material around the gate structure;
   forming a protection mask over the non-conformal spacer material, wherein the non-conformal spacer material encapsulates the gate structure and prevents contact between the protection mask and the gate structure;
   etching the non-conformal spacer material and protection mask to form a salicidation spacer; and
   forming a self-aligned silicide contact adjacent the salicidation spacer.

2. The method of claim 1 further comprising annealing the semiconductor substrate after performing the ion implantation and before forming a self-aligned silicide contact adjacent the salicidation spacer.

3. The method of claim 1 wherein forming over a semiconductor substrate a gate structure comprises:
   forming a high-k dielectric layer on the semiconductor substrate;
   forming a metal electrode on the high-k dielectric layer;
   forming a gate cap over the metal electrode; and
   forming an electrode adjacent spacer around the metal electrode and gate cap;
   wherein the method further comprises:
   performing an ion implantation into the semiconductor substrate using the electrode adjacent spacer and gate cap as a mask, wherein depositing the non-conformal spacer material around the gate structure comprises depositing a non-conformal spacer material around the electrode adjacent spacer.

4. The method of claim 1 wherein:
   forming the gate structure overlying the semiconductor substrate comprises forming a first gate structure and a second gate structure overlying the semiconductor substrate;
   depositing the non-conformal spacer material around the gate structure comprises depositing the non-conformal spacer material around the gate structures;
   forming the protection mask over the non-conformal spacer material comprises forming the protection mask over the non-conformal spacer material overlying the second gate structure;
   etching the non-conformal spacer material and protection mask to form the salicidation spacer comprises etching the non-conformal spacer material overlying the first gate structure and the non-conformal spacer material and protection mask overlying the second gate structure to form a first salicidation spacer overlying the first gate structure and a second salicidation spacer overlying the second gate structure; and
   forming a self-aligned silicide contact adjacent the salicidation spacer comprises forming self-aligned silicide contacts adjacent the salicidation spacers.

5. A method for fabricating an integrated circuit comprising:
   forming a gate structure overlying a semiconductor substrate, wherein forming a gate structure comprises forming over the semiconductor substrate a gate electrode encapsulated by a gate cap and an electrode adjacent spacer;
   depositing a non-conformal spacer material around the gate structure, wherein depositing a non-conformal spacer material around the gate structure comprises depositing a non-conformal spacer material around the electrode adjacent spacer;
   forming a protection mask over the non-conformal spacer material;
   etching the non-conformal spacer material and protection mask to form a salicidation spacer; and
   forming a self-aligned silicide contact adjacent the salicidation spacer.

6. The method of claim 5 further comprising performing an ion implantation into the semiconductor substrate using the electrode adjacent spacer and gate cap as a mask.

7. The method of claim 5 wherein forming over the semiconductor substrate a gate electrode encapsulated by a gate cap comprises forming a high-k dielectric layer on the semiconductor substrate and forming a metal electrode on the high-k dielectric layer.

8. The method of claim 5 wherein depositing a non-conformal spacer material around the gate structure comprises depositing silicon nitride by plasma-enhanced chemical vapor deposition (PECVD) around the gate structure.

9. The method of claim 8 wherein forming a protection mask over the non-conformal spacer material comprises:
   spin coating a protection layer onto the non-conformal spacer material; and
   developing the protection layer to form the protection mask.

10. The method of claim 5 wherein forming a self-aligned silicide contact adjacent the salicidation spacer comprises:
    depositing a metal over the integrated circuit; and
    reacting the metal with the semiconductor substrate to form the self-aligned silicide contact adjacent the salicidation spacer.

11. A method for fabricating an integrated circuit comprising:
    forming over a semiconductor substrate a gate structure;
    forming a conformal spacer around the gate structure;
    performing an ion implantation into the semiconductor substrate using the conformal spacer as a mask; and
    removing the conformal spacer;
    depositing a non-conformal spacer material around the gate structure;
    etching the non-conformal spacer material to form a salicidation spacer; and
    forming a self-aligned silicide contact adjacent the salicidation spacer.

12. The method of claim 11 wherein forming over a semiconductor substrate a gate structure comprises forming over the semiconductor substrate a gate electrode encapsulated by a gate cap and an electrode adjacent spacer, wherein forming a conformal spacer around the gate structure comprises forming a conformal spacer around the electrode adjacent spacer, and wherein depositing a non-conformal spacer material around the gate structure comprises depositing a non-conformal spacer material around the electrode adjacent spacer.

13. The method of claim 12 wherein forming over the semiconductor substrate a gate electrode encapsulated by a gate cap comprises forming a high-k dielectric layer on the semiconductor substrate and forming a metal electrode on the high-k dielectric layer.

14. The method of claim 12 further comprising:
performing an ion implantation into the semiconductor substrate using the electrode adjacent spacer and gate cap as a mask; and
performing an ion implantation into the semiconductor substrate using the conformal spacer as a mask.

15. The method of claim 11 wherein depositing a non-conformal spacer material around the gate structure comprises depositing silicon nitride by plasma-enhanced chemical vapor deposition (PECVD) around the gate structure.

16. The method of claim 11 wherein forming a self-aligned silicide contact adjacent the salicidation spacer comprises:
depositing a metal over the integrated circuit; and
reacting the metal with the semiconductor substrate to form the self-aligned silicide contact adjacent the salicidation spacer.

17. The method of claim 11 further comprising forming a protection mask over the non-conformal spacer material.

18. The method of claim 17 wherein etching the non-conformal spacer material to form a salicidation spacer comprises etching the non-conformal spacer material and the protection mask to form a salicidation spacer.

19. The method of claim 17 wherein forming a protection mask over the non-conformal spacer material comprises:
spin coating a protection layer onto the non-conformal spacer material; and
developing the protection layer to form the protection mask.

* * * * *